United States Patent [19]

Miller et al.

[11] Patent Number: 5,331,645
[45] Date of Patent: Jul. 19, 1994

[54] EXPANDABLE DIGITAL ERROR DETECTION AND CORRECTION DEVICE

[75] Inventors: Michael J. Miller, Saratoga; Andy P. Chan, San Jose; Robert W. Stodieck, Santa Clara; John R. Mick, Los Altos Hills, all of Calif.

[73] Assignee: Integrated Device Technology, Inc., Santa Clara, Calif.

[21] Appl. No.: 54,346

[22] Filed: Apr. 26, 1993

Related U.S. Application Data

[63] Continuation of Ser. No. 466,030, Jan. 17, 1990, abandoned.

[51] Int. Cl.[5] .......................................... H03M 13/00
[52] U.S. Cl. ................................ 371/37.1; 371/37.6; 371/40.1
[58] Field of Search ..................... 371/37.1, 37.6, 40.1

[56] References Cited

PUBLICATIONS

Tate, G. et al., "EDC Chip Boosts Memory Reliability", *Electronic Design*, Sep. 1, 1980, pp. 151–155.
Twaddel, W., "Error-Checking and-Correcting ICs See Wider Use as Memory Size Grows", *EDN*, Mar. 4, 1981, pp. 31–40.
Bazes, M. et al., "Keep Memory Design Simple Yet Call Single-Bit Errors", *Electronic Design*, Sep. 30, 1981, pp. 195–201.

*Primary Examiner*—Stephen M. Baker
*Attorney, Agent, or Firm*—Thomas E. Schatzel

[57] ABSTRACT

A pair of similar, 32-bit, error detection and correction devices, including a "lower 32-bit" device (210) and an "upper 32-bit" device (212) are configured as a 64-bit, error detection and correction system. When a (64-bit) word of data is being stored in memory, the lower 32-bit device (210) develops, on an inter-device bus (226), signals representing generation partial check bits. The upper 32-bit device (212) receives the partial check bits (226), and develops signals representing final check bits (236) for storage with the corresponding data word in memory (220 and 234). When a (64-bit) word of data is being retrieved from memory, from signals representing check bits retrieved from memory (222), the lower 32-bit device (210) generates on an inter-device bus (224), signals representing correction partial syndromes. From the correction partial syndromes (224), the upper 32-bit device (212) develops, on another inter-device bus (228), signals representing correction partial check bits; generates full syndromes; and corrects errors in the upper 32-bits of the corresponding retrieved data word (240). From the correction partial check bits (228) the lower 32-bit device (210) (also) generates full syndromes; and corrects errors in the corresponding lower 32-bits of the retrieved data word (230).

10 Claims, 2 Drawing Sheets

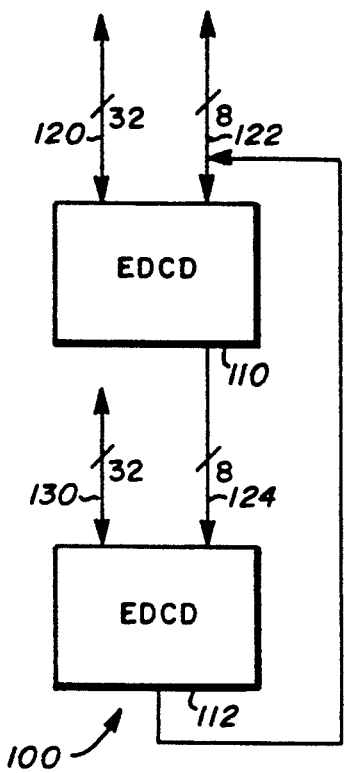
Fig_1
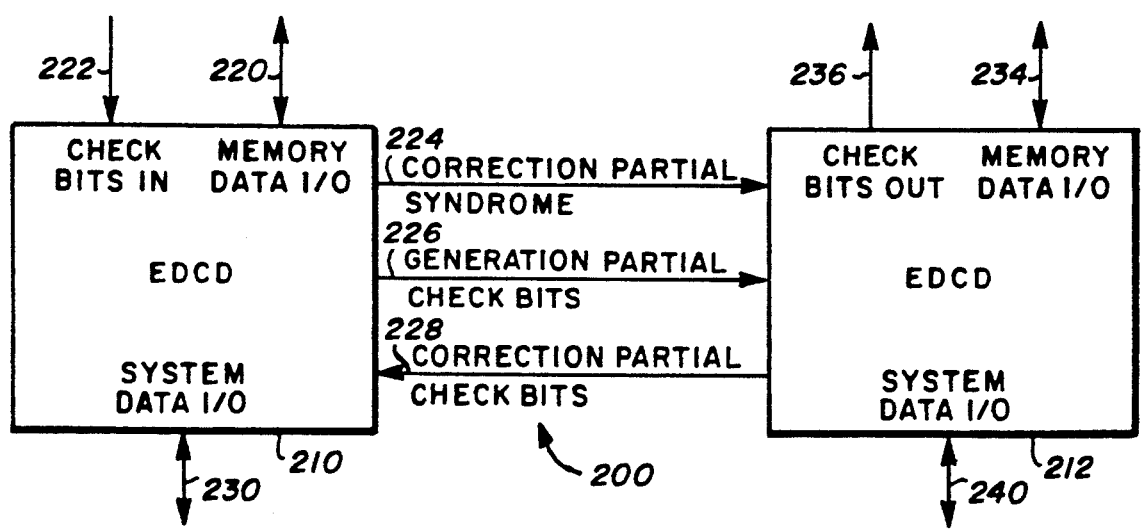
Fig_2

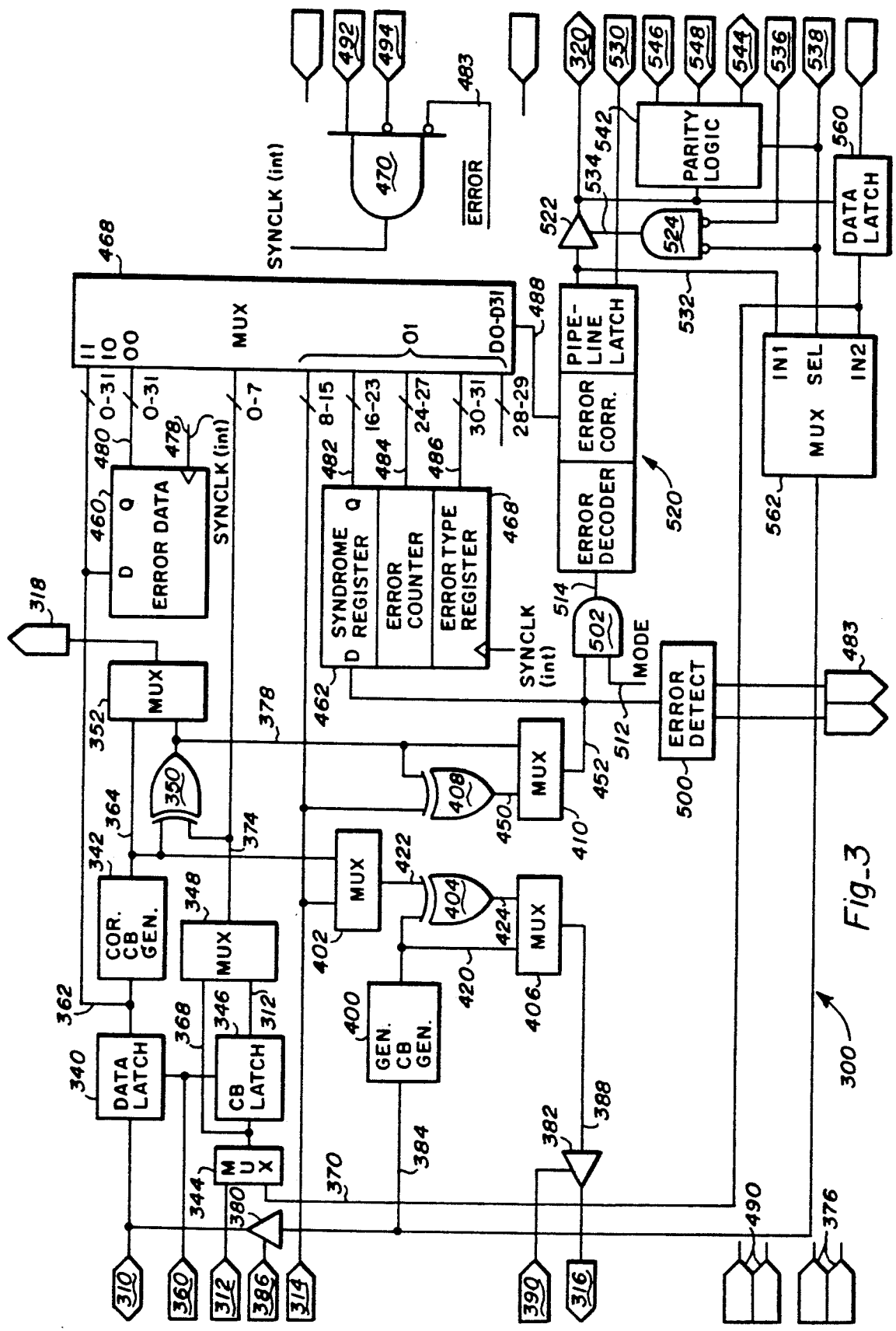
Fig_3

EXPANDABLE DIGITAL ERROR DETECTION AND CORRECTION DEVICE

This is a continuation of copending application Ser. No. 07/466,030, filed on Jan. 17, 1990, now abandoned.

TECHNICAL FIELD

The present invention relates to integrated circuit-type devices generally and more particularly to a digital error detection and correction device having means for word expansion with low propagation delay.

BACKGROUND ART

Data (information) stored in integrated circuit-type memory devices is susceptible to corruption, due, in part, to the bombardment of the devices by alpha particles. To provide a means for error detection and correction, often times, redundant data is stored. Rather than storing an exact copy of the data, commonly, "check bits" generated in accordance with the data encoding scheme known as "Hamming code" are stored. From a "word" of data, each of the check bits is generated by "EXORing" (gating together in exclusive OR gates) selected bits from the data word. When a data word is retrieved from the memory devices, the corresponding check bits are also retrieved. From the retrieved data word and the corresponding retrieved check bits, in accordance with the Hamming code scheme, "syndromes" are generated, by EXORing selected bits of the retrieved data word with the corresponding bits of the retrieved check bits. The syndromes are used for detecting and correcting error(s) in the retrieved data word.

Typical of prior art-type error detection and correction devices are devices of the type which are designated IDT 49C460 by Integrated Device Technology, Inc. (and AM 29C660 by Advanced Micro Devices, Inc.) and which are described in the corresponding data sheets and on pages 8-235 to 8-255 of the data book by Integrated Device Technology, Inc. entitled "High Performance CMOS 1988 Data Book." The above-mentioned (49C460) devices are intended for use with data words which are 32 binary bits in length. In addition, the above-mentioned devices have provisions for "word expansion" (means by which one device may be configured, with a similar device, in cascade, for use with data words which are 64 binary bits in length). (A 64-bit, prior-art-type, error detection and correction system is illustrated in FIG. 1 of the drawing generally designated by the number 100.) When so expanded, one of two similar devices is configured as a "lower 32-bit" device (represented in the figure by a block 110) and the other one of the two devices is configured as an "upper 32-bit" device (represented in the figure by a block 112). The lower 32-bit device (110) is configured, with a set of 32 data inputs/outputs of the device connected, each to a corresponding line of a lower 32-bit data bus 120; with a set of eight, device check-bit inputs connected, each to a corresponding line of an eight-line syndrome/check-bit bus 122; and with a set of eight, device syndrome/check-bit outputs connected, each to a corresponding line of an eight-line inter-device bus 124. The upper 32-bit device (112) is configured with tile set of 32 data device inputs/outputs connected, each to a corresponding line of an upper 32-bit data bus 130; with the set of eight, device check-bit inputs connected, each to a corresponding line of the eight lines of the inter-device bus (124); and with the set of eight, device syndrome/check bit outputs connected, each to a corresponding line of the eight lines of the syndrome/check bit bus 122.

When a (64-bit) word of data is being stored in memory, signals representing the lower 32-bits of the data word are developed on the lower 32-bit data bus (120) and signals representing the upper 32-bits of the data word are developed on the upper 32-bit data bus (130). Responsive to the signals representing the lower 32-bits of the data word (developed on lower 32-bit data bus 120) the lower 32-bit device (110) generates partial check bits and develops on the inter-device bus (124) signals representing the generation partial check bits. Responsive to the signals representing the upper 32-bits of the data word (developed on upper 32-bit data bus 130) and to the signals representing the generation partial check bits (generated by lower 32-bit device 110 on inter-device bus 124) the upper 32-bit device 1112) generates final check bits and develops on the syndrome/check bit bus (122) signals representing the final check bits. The final check bits (represented by the signals generated by upper 32-bit device 112 on syndrome/check bit bus 122) are stored with the (64-bits of the) data word in memory.

When a (64-bit) word of data is being retrieved from memory, signals representing the lower 32-bits of the retrieved data word are developed on the lower 32-bit data bus (120); signals representing the upper 32-bits of the retrieved data word are developed on the upper 32-bit data bus (130); and signals representing the corresponding, retrieved, check bits are developed on the syndrome/check bit bus (122). Responsive to certain control signals, the lower 32-bit device (110) is operative to latch the state of the signals representing the lower 32-bits of the retrieved data word (developed on lower 32-bit data bus 120) and to latch the state of the signals representing the retrieved check bits (developed on syndrome/check bit bus 122). In addition, responsive to the state of the latched, lower 32-bits of the retrieved data word the lower 32-bit device (110) generates (new) correction partial check bits. Further, responsive to the (new) correction partial check bits and to the state of the latched, retrieved, check bits, the lower 32-bit device (110) is operative to generate correction partial syndrome bits and to develop, on the inter-device bus (124), signals representing the correction partial syndrome bits. Responsive to the control signals, the upper 32-bit device (112) is operative to latch the state of the signals representing the upper 32-bits of the retrieved data word (developed on upper 32-bit data bus 130). In addition, responsive to the state of the latched, upper 32-bits of the retrieved data word the upper 32-bit device (112) generates, new, correction partial check bits. Further, responsive to the new correction partial check bits and to the state of the correction partial syndrome-bit signals (developed by lower 32-bit device 110 on inter-device bus 124) the upper 32-bit device (112) is operative to generate full syndrome bits and to develop, on the syndrome/check bit bus (122), signals representing the full syndromes. Finally, responsive to the state of the latched, upper 32-bits of the retrieved data word and to the full syndromes, the upper 32-bit device (112) corrects errors in the latched, upper 32-bits of the data word and develops, on the upper 32-bit data bus (130), signals representing the corrected, upper 32-bits of the data word. Finally, responsive to the state of the latched, lower 32-bits of the retrieved data word and to the signals representing the full syndromes (developed by upper 32-bit device 112 on syndrome/check bit bus 122) the lower 32-bit device (110) corrects errors in the latched, lower 32-bits of the data word and develops, on the lower 32-bit data bus (120), signals representing the corrected, lower 32-bits of the data word.

It is important to note that, when a pair of the above-mentioned (49C460 type) devices are so configured (for word expansion), when a word of data is being retrieved from memory, developed on the syndrome/check bit bus (122) are signals representing the retrieved check bits followed by signals representing the full syndromes. As a consequence, when so configured, the above-mentioned (49C460 type) devices are relatively slow (have relatively high propagation delays) and require relatively complex (control) circuitry (for developing the requisite control signals).

For additional information regarding the above-mentioned (49C460 type) devices and the generation of the Hamming code type check bits and syndrome bits they employ, the reader is referred to the above-mentioned 49C460 data sheets and/or the above-mentioned "High Performance CMOS 1988 Data Book." Other prior-art-type error detection and correction devices include those of the type which are designated 8206 by Intel Inc., those of the type which are designated DP8400-2 by National Semiconductor Inc., those of the type which are designated MB1426 by Fujitsu Inc., and those of the type which are designated SN54ALS632B by Texas Instruments Inc.

DISCLOSURE OF THE INVENTION

It is therefore the primary object of the present invention to provide a 32-bit error detection and correction device having provisions for word expansion which is relatively fast.

Another object of the present invention is to provide a 32-bit error detection and correction device having provisions for word expansion which is relatively simple to control.

Yet another object of the present invention is to provide a 64-bit error detection and correction system which is both relatively fast and relatively simple to control.

Briefly, the presently preferred embodiment of a 64-bit, error detection and correction system in accordance with the present invention employs a pair of (two) similar, 32-bit, error detection and correction devices, one of which is configured as a "lower 32-bit" device (210) and the other one of which is configured as an "upper 32-bit" device (212).

When a (64-bit) word of data is being stored in memory, the lower 32-bit device (210) receives signals representing the lower 32-bits of the data word (230) and develops, on an inter-device bus (226), signals representing generation partial check bits. The upper 32-bit device (212) receives signals representing the upper 32-bits of the data word (240); receives, from the lower 32-bit device, the signals representing the generation partial check bits (226); and develops signals representing final check bits (236) for storage with the data word in memory (220 and 234).

When a (64-bit) word of data is being retrieved from memory, the lower 32-bit device (210) receives signals representing the lower 32-bits of the retrieved data word (220) and receives signals representing check bits retrieved from memory (222). Therefrom, the lower 32-bit device (210) generates correction partial check bits and develops, on another inter-device bus (224), signals representing correction partial syndromes. The upper 32-bit device (212) receives signals representing the upper 32-bits of the retrieved data word (234) and receives, from the lower 32-bit device, the signals representing the correction partial syndromes (224). The upper 32-bit device (212) receives signals representing the upper 32-bits of the retrieved data word (234). From only the upper 32-bits of the retrieved data word, without waiting for the lower 32-bit device (210), the upper 32-bit device (212) develops, on yet another inter-device bus (228), signals representing correction partial check bits. In addition, the upper 32-bit device (212) receives, from the lower 32-bit device (210), the signals representing the correction partial syndromes (224). Therefrom, the upper 32-bit device (212) generates full syndromes; and corrects errors in the upper 32-bits of the retrieved data word (240). The lower 32-bit device (210) receives, from the upper 32-bit device (212), the signals representing the correction partial check bits (228); (also) generates full syndromes; and corrects errors in the lower 32-bits of the retrieved data word (230).

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a block diagram of a prior-art-type, 64-bit, error detection and correction system;

FIG. 2 is a block diagram of the presently preferred embodiment of a 64-bit, error detection and correction system in accordance with the present invention; and FIG. 3 is a schematic diagram of the presently preferred embodiment of a 32-bit, error detection and correction device representative of the devices shown in FIG. 2.

BEST MODE FOR CARRYING OUT THE INVENTION

Illustrated in FIG. 2 of the drawing generally designated by the number 200 is the presently preferred embodiment of a 64-bit, error detection and correction system in accordance with the present invention. System 200 employs a pair of (two) similar, 32-bit, error detection and correction devices each having provisions for "word expansion" (means by which one device may be configured, with a similar device, in cascade, for use with data words which are 64 binary bits in length). When so expanded, one of two similar devices is configured as a "lower 32-bit" device (represented in the figure by a block 210) and the other one of the two devices is configured as an "upper 32-bit" device (represented in the figure by a block 212). The lower 32-bit device (210) is configured with a set of 32, memory-data-inputs/outputs of the device connected, each to a corresponding line of a 32-line, lower 32-bit, memory-data bus 220. In addition, device 210 is configured with a set of eight, combination, generation-check-bit/correction-partial-syndrome inputs of the device connected, each to a corresponding line of an eight-line, memory (out) check-bit bus 222. Further, device 210 is configured with a set of eight, combination, correction-partial-syndrome/correction-partial-check-bit outputs of the device connected, each to a corresponding) line of an eight-line, correction-partial-syndrome, inter-device bus 224; with a set of eight, combination, generation-partial-check-bit/generation-check-bit outputs of the device connected, each to a corresponding line of an eight-line generation-partial-check-bit, inter-device bus 226; and with a set of eight, combination, correction-partial-check-bit/generation-partial-check-bit inputs of the device connected, each to a corresponding line of an eight-line correction-partial-check-bit, inter-device bus 228. Finally, device 210 is configured with a set of 32, system-data-inputs/outputs of the device connected, each to a corresponding line of a 32-line, lower 32-bit, system-data bus 230.

The upper 32-bit device (212) is configured with the set of 32, memory-data-inputs/outputs of the device connected, each to a corresponding line of a 32-line, upper 32-bit, memory-data bus 234. Further, device 212 is configured with the set of eight, combination, generation-partial-check-bit/generation-check-bit outputs of the device connected, each to a corresponding line of an eight-line, memory (in) check-bit bus 236. In addition, device 212 is configured with the set of eight, combination, generation-check-bit/correction-partial-syndrome inputs of the device connected, each to a corresponding line of the eight lines of the correction-partial-syndrome, inter-device bus 224; with the set of eight, combination, correction-partial-check-bit/-generation-partial-check-bit inputs of the device connected, each to a corresponding line of the eight lines of the generation-partial-check-bit, inter-device bus 226; and with the set of eight, combination, correction-partial-syndrome/-correction-partial-check-bit outputs connected, each to a corresponding line of the eight lines of the correction-partial-check-bit, inter-device bus 228. Finally, device 212 is configured and with the set of 32, system-data-inputs/outputs of the device connected, each to a corresponding line of a 32-line, upper 32-bit, system-data bus 240.

When a (64-bit) word of data is being stored in memory, signal s representing the lower 32-bits of the data word are developed on the 32 lines of the lower 32-bit system-data bus (230) and signals representing the upper 32-bits of the data word are developed on the 32 lines of the upper 32-bit system-data bus (240). Responsive to the state of the signals representing the lower 32-bits or the data word (developed on the 32 lines of lower 32-bit system-data bus 230) the lower 32-bit device (210) develops signals of similar state on the 32 lines of the lower 32-bit memory-data bus (220). Further, responsive to the state of the signals representing the lower 32-bits or the data word (developed on the 32 lines of lower 32-bit system-data bus 230) the lower 32-bit device (210) generates generation partial check bits and develops on the eight lines of the generation-partial-check-bit, inter-device bus (226), signals representing the generation partial check bits. Responsive to the state of the signals representing the upper 32-bits of the data word (developed on the 32 lines of upper 32-bit system-data bus 240) the upper 32-bit device (212) develops signals of similar state on the 32 lines of the upper 32-bit memory-data bus (234). Further, responsive to the state of the signals representing the upper 32-bits of the data word (developed on the 32 lines of upper 32-bit system-data bus 230) and to the signals representing the generation partial check bits (developed by lower 32-bit device 210 on the eight lines of generation-partial-check-bit, inter-device bus 226) the upper 32-bit device (212) generates final check bits and develops on the eight lines of the memory (in) check-bit bus (236) signals representing the final check bits. The final check bits (represented by the signals developed by upper 32-bit device 212 on the eight lines of memory (in) check-bit-bus 236) are stored with the (64-bits of the) data word in memory.

When a (64-bit) word of data is being retrieved from memory, signals representing the lower 32-bits of the retrieved, data word are developed on the 32 lines of the lower 32-bit system-data bus (230); signals representing the upper 32-bits of the retrieved, data word are developed on the 32 lines of the upper 32-bit system-data bus (240); and signals representing the, corresponding, retrieved, check bits are developed on the eight lines of the memory (out) check-bit bus (222). Responsive to certain control signals, the lower 32-bit device (210) is operative to latch the state of the signals representing the lower 32-bits of the retrieved, data word (developed on the 32 lines of the lower 32-bit system-data-bus (230) and to latch the state of the signals representing the retrieved, check bits (developed on the eight lines of the memory (out) check-bit bus (222). In addition, responsive to the state of the latched, lower 32-bits of the retrieved, data word the lower 32-bit device (210) generates (new) correction partial check bits. Further, responsive to the correction partial check bits and to the state of the latched, retrieved, check bits, the lower 32-bit device (210) is operative to generate correction partial syndrome bits and to develop, on the eight lines of the correction-partial-syndrome, inter-device bus (224), signals representing the correction partial syndrome bits.

Also, when a (64-bit) word of data is being retrieved from memory, responsive to the control signals, the upper 32-bit device (212) is operative to latch the state of the signals representing the upper 32-bits of the retrieved, data word (developed on the 32 lines of the upper 32-bit system-data bus (240). In addition, responsive to the state of the latched, upper 32-bits of the retrieved, data word the upper 32-bit device (212) generates (new) correction partial check bits and develops, on the eight lines of the correction-partial-check-bit, inter-device bus (228), signals representing the correction partial check bits. Further, responsive to the correction partial check bits and to the correction partial syndrome bits (represented by the signals developed by lower 32-bit device 210 on the eight lines of correction-partial-syndrome, inter-device bus 224) the upper 32-bit device (212) is operative to generate full syndrome bits. Finally, responsive to the state of the latched, upper 32-bits of the retrieved, data word and to the full syndromes, the upper 32-bit device (212) corrects errors in the latched, upper 32-bits of the data word and develops, on the 32 lines of the upper 32-bit system-data bus (240), signals representing the corrected, upper 32-bits of the data word.

Finally, when a (64-bit) word of data is being retrieved from memory, responsive to the correction partial check bits generated by the lower 32-bit device (210) and to the correction partial check bits (represented by the signals developed by upper 32-bit device 212 on the eight lines of the correction-partial-check-bit, inter-device bus (228)), the lower 32-bit device (212) is operative to, also, generate full syndrome bits. Finally, responsive to the state of the latched, lower 32-bits of the retrieved, data word and to the full syndromes, the lower 32-bit device (212) corrects errors in the latched, lower 32-bits of the data word and develops, on the 32 lines of the lower 32-bit system-data bus (230), signals representing the corrected, lower 32-bits of the data word.

It is important to note that the full syndrome bits are generated in both devices (210 and 212) at the same time, (as opposed to being generated in one of the two devices and being sent to the other one of the two devices). Also, it is important to note that, during the various operations, no bus is being switched in order to carry more than one set of signals. When a (64-bit) word of data is being retrieved from memory, the lower 32-bit device (210) develops the correction partial syndrome bit signals on the eight lines of the correction-partial-syndrome, inter-device bus (224) at the same time the upper 32-bit device (212) develops the correction partial check bit signals on the eight lines of the correction-partial-check-bit, inter-device bus (228). As a consequence, 64-bit, error detection and correction system 200 is relatively fast (has relatively low propagation delay) and require relatively simple (control) circuitry (for developing the requisite control signals).

Illustrated in FIG. 3, of the drawing, generally designated by the number 300, is the presently preferred embodiment, in accordance with the present invention, of 32-bit, error detection and correction device, which is representative of devices 210 and 212 (shown in FIG. 2). Device 300 includes a 32-line, memory-data-input/output bus 310; an eight-line, combination, generation-check-bit/correction-partial-syndrome input bus 312 (for use as a generation-check-bit input bus when device 300 is configured as a lower 32-bit device and for use as a correction-partial-syndrome input bus when device 300 is configured as an upper 32-bit device). In addition, device 300 includes an eight-line, combination, correction-partial-check-bit/generation-partial-check-bit input bus 314; an eight-line, combination, generation-partial-check-bit/generation-check-bit output bus 316; an eight-line, combination, correction-partial-syndrome/correction-partial-check-bit output bus 318; and a 32-line, system-data-input/output bus 320. (When device 300 is used as a lower 32-bit device in a 64-bit, error detection and correction system, as represented in FIG. 2 by block 210, bus 310 (shown in FIG. 3) is connected to bus 222 (shown in FIG. 2); bus 312 is connected to bus 222; bus 314 is connected to bus 228; bus 316 is connected to bus 226; bus 318 is connected to bus 224; and bus 320 is connected to bus 230. When device 300 is used as an upper 32-bit device in a 64-bit, error detection and correction system, as represented in FIG. 2 by block 212, bus 310 is connected to bus 234; bus 312 is connected to bus 224; bus 314 is connected to bus 226; bus 316 is connected to bus 236; bus 318 is connected to bus 228; and bus 320 is connected to bus 240.)

Error detection and correction device 300 includes a data latch (array) 340, a correction check bit generator 342, a multiplexer (array) 344, a check bit latch (array) 346, another multiplexer (array) 348, a gate (array) 350, and yet another multiplexer (array) 352. Data latch (array) 340 is of the type which has 32 separate latches, each of which is configured to latch the state of a signal externally developed on the corresponding line of the 32 lines of memory-data-input/output bus 310 at each of the times delineated by a memory-latch-enable control signal externally developed on a line 360 and to develop a signal having the latched state on the corresponding line of a 32-line bus 362. Correction check bit generator 342 is configured to develop, on an eight-line bus 364, signals, the state of which represent check bits generated from the number represented by the state of the 32 signals developed on bus 362.

Multiplexer (array) 344 is of the type which has eight separate multiplexers each of the two-line-to-one-line type. The separate multiplexers of multiplexer (array) 344 are each configured to develop on the various lines of an eight-line bus 368 signals the state of which correspond either each to the state of the corresponding one of the eight signals externally developed on generation-check-bit/correction-partial-syndrome input bus 312 or each to the state of the corresponding one of the various signals developed on an eight-line bus 370. More specifically, the separate multiplexers of multiplexer (array) 344 are each configured, with one of the two multiplexer (data) inputs connected to the corresponding line of the eight lines of bus 312; with the other one of the two multiplexer (data) inputs connected to the corresponding line of the eight lines bus 370; and with the multiplexer (data) output connected to the corresponding line of the eight lines of bus 370. Multiplexer (array) 344 is used for diagnostic purposes to inject, arbitrary, eight-bit, check-bit patterns into check bit latch (array) 346. Check bit latch (array) 346 is of the type which has eight separate latches, each of which is configured to latch the state of a signal developed on a corresponding one of the eight lines of bus 370 at each of the times delineated by the memory-latch-enable control signal externally developed on line 360 and to develop a signal having the latched state on a corresponding line of an eight-line bus 372. Multiplexer (array) 348, which is similar to multiplexer (array) 344, is, also, of the type which has eight separate two-line-to-one-line multiplexers, which, in this case, are configured to develop signals on the various lines of an eight line bus 374 the state of which correspond either each to the state of the corresponding one of the eight signals developed on bus 372 or each to the state of the corresponding one of the eight signals developed on bus 368 (as selected responsive to the state of a pair of device function 32-bit-mode/lower-32-bit-device-of-64-bit-mode/upper-32-bit-device-of-64-bit-mode/64-check-bit-generate-only-mode identification signals externally developed on a pair of lines, which are collectively designated 376).

Gate (array) 350 is of the type which has eight, separate, (two-input) exclusive OR gates, each of which is configured to gate together the state of the signal developed on the corresponding line of the eight lines of bus 364 with the state of the signal developed on the corresponding line of the eight lines of bus 374 and to develop a signal having the resultant state on a corresponding line of an eight line bus 378. Multiplexer (array) 352, which is, also, similar to multiplexer (array) 344, is, also, of the type which has eight separate two-line-to-one-line multiplexers, which, in this case, are configured to develop signals on the eight lines of correction-partial-syndrome/correction-partial-check-bit output bus 318 the state of which correspond either each to the state of the corresponding one of the eight signals developed on bus 364 or each to the state of the corresponding one of the eight signals developed on bus 378 (also as selected responsive to the state of the pair of externally developed, identification signals developed on lines 376).

Further, error detection and correction device 300 includes a pair of tri-state buffer (arrays), which are respectively designated 380 and 382. Tri-state buffer (array) 380 is of the type which has 32, separate, tri-state buffers, each of which is configured to develop on the corresponding line of the 32-line, memory-data-input-/output bus 310 a signal, the state of which corresponds to the state of a signal developed on the corresponding line of a 32-line bus 384, at each of the times delineated by a memory-output-enable control signal externally developed on a line 386. Tri-state buffer (array) 382 is of the type which has eight, separate, tri-state buffers, each of which is configured to develop on the corresponding line of the eight line generation-partial-check-bit/generation-check-bit output bus 316 a signal, the state of which corresponds to the state of a signal developed on the corresponding line of an eight line bus 388, at each of the times delineated by a check-bits-output-enable control signal externally developed on a line 390.

In addition, error detection and correction device 300 includes a generation check bit generator 400, another multiplexer (array) 402, another gate (array) 404, yet another multiplexer (array) 406, yet another a gate (array) 408, and yet another multiplexer (array) 410. Generation check bit generator 400 is configured to develop, on an eight-line bus 420, signals, the state of which represent check bits generated from the number represented by the state of the 32 signals developed on bus 384. Multiplexer (array) 402, which is, also, similar to multiplexer (array) 344, is, also, of the type which has eight, separate, two-line-to-one-line multiplexers, which, in this case, are configured to develop signals on the various lines of an eight line bus 422 the state of which correspond either each to the state of the corresponding one of the eight signals externally, developed on correction-partial-check-bit/generation-partial-check-bit input bus 314 or each to the state of the corresponding one of the eight signals developed on bus 364 (also as selected responsive to the state of the pair of externally developed, identification signals developed on lines 376). Gate (array) 404, which is similar to gate (array) 350, is, also, of the type which has eight, separate, (two-input) exclusive OR gates, each of which is configured, in this case, to gate together the state of the signal developed on the corresponding line of the eight lines of bus 420 with the state of the signal developed on the corresponding line of the eight lines of bus 422 and to develop a signal having the resultant state on a corresponding line of an eight line bus 424. Multiplexer (array) 406, which is, also, similar to multiplexer (array) 344, is, also, of the type which has eight separate two-line-to-one-line multiplexers, which, in this case, are configured to develop signals on the eight lines of bus 388, the state of which correspond either each to the state of the corresponding one of the eight signals developed on bus 420 or each to the state of the corresponding one of the eight signals developed on bus 422 (also, as selected responsive to the state of the pair of identification signals externally developed on lines 376).

Gate (array) 408, which is, also, similar to gate (array) 350, is, also, of the type which has eight separate (two-input) exclusive OR gates, each of which is configured, in this case, to gate together the state of the signal developed on the corresponding line of the eight lines of correction-partial-check-bit/generation-partial-check-bit input bus 314 with the state of the signal developed on the corresponding line of the eight lines of bus 378 and to develop a signal having the resultant state on a corresponding line of an eight line bus 450. Multiplexer (array) 410, which is, also, similar to multiplexer (array) 344, is, also, of the type which has eight separate two-line-to-one-line multiplexers, which, in this case, are configured to develop signals (representing syndrome bits) on the various lines of an eight line bus 452 the state of which correspond either each to the state of the corresponding one of the eight signals developed on bus 450 or each to the state of the corresponding one of the eight signals developed on bus 378 (also as selected responsive to the state of the pair of identification signals externally developed on lines 376).

Also, for diagnostic purposes, error detection and correction device 300 includes an error data register (array) 460, a syndrome register (array) 462, an error counter 464, an error type register (array) 466, another multiplexer (array) 468, and a gate 470. Error data register (array) 460 is of the type which has 32, separate, registers (D-type flip-flops), each of which is configured to register the state of a signal developed on the corresponding line of the 32 lines of bus 362 at each of the times delineated by a synchronization-clocking signal developed on a line 478 (when an error occurs) and to develop a signal having the registered state on the corresponding line of a 32-line bus 480. Syndrome register (array) 462 is of the type which has eight separate registers, each of which is configured to register the state of a signal developed on the corresponding line of the eight lines of bus 452 and to develop a signal having the registered state on the corresponding line of an eight-line bus 482. Error counter 464 is configured to count the errors (0-15) represented by the errors indicated by an error detection signal developed on a line 483 and to develop on the various lines of a four line bus 484 signals representing the count. Error type register (array) 466 is of the type which has two separate registers, which are configured to register signals representing the error type indicated by the error signal developed on line 483 at each of the times delineated by the synchronization-clocking signal developed on line 478 and to develop signals having the registered state on the various lines of a two-line bus 486. Error data register 460, syndrome register 462, and error type register 466 only register the information from the first error that occurs, as indicated by the signals developed by error counter 464 and the synchronization-clocking signal developed on a line 478. Multiplexer (array) 468 is of the type which has 32 separate multiplexers each of the three-line-to-one-line type. The separate multiplexers of multiplexer (array) 468 are each configured to develop on the various lines of a 32-line bus 488 signals, the state of which correspond either each to the state of the corresponding one of the 32 signals developed on bus 362, or each to the state of the corresponding one of the 32 signals developed on bus 480, or each to the state of the respective one of the 32 signals developed on the combination of busses 482, 484, and 486 (as selected responsive to the state of a pair of mode signals externally developed on a pair of lines, which are collectively designated 490). More specifically, the separate multiplexers of multiplexer (array) 468 are each configured, with one of the three multiplexer (data) inputs connected to the corresponding line of the 32 lines of bus 362 and with another one of the three multiplexer (data) inputs connected to the corresponding line of the 32 lines of bus 480. Further, the separate multiplexers of multiplexer (array) 468 are each configured, with the third one of the three multiplexer (data) inputs connected, the eight lowest order inputs to the corresponding lines of the eight lines of bus 374, with the next eight lowest order multiplexer (data) inputs connected to the respective lines of the eight lines of correction-partial-check-bit/generation-partial-check-bit input bus 314, and with the next eight lowest order multiplexer (data) inputs connected to the respective lines of bus 482. The eight highest order multiplexer (data) inputs of the separate multiplexers of multiplexer (array) 468 are connected, four to the four lines of bus 484 and two to the two lines of bus 486. The 32 multiplexer (data) outputs of the separate multiplexers of multiplexer (array) 468 are each connected to the corresponding line of the various lines of a 32-line bus 488. Gate 470, which is of the three-input AND type, is configured, with (a non-inverting) one of the three gate inputs connected to a line 492, to receive an externally developed synchronization clocking signal; with an (inverting) one of the three gate inputs connected to a line 494, to receive an externally developed synchronization clock enabling signal; with the other (inverting) one of the three gate inputs connected to a line 476, to receive a signal the state of which indicates if an error has been detected; and with the gate output connected to line 478.

Further, error detection and correction device 300 includes an error detector 500 and a gate (array) 502. Error detector 500 includes gates configured to combine the signals representing full syndrome bits developed on bus 452 to develop the error signal on line 483, the state of which indicates when there are no errors (the syndrome bit signals all have a low logic level) and to develop on a line 510 a signal, the state of which indicates whether a detected error is singular (correctable) (only one of the syndrome bit signals has a high logic level) or multiple (non-correctable) (multiple syndrome bit signals have a high logic level). Gate (array) 502 has eight, two-input AND gates, each configured, with one or the two gate inputs connected to the corresponding line of the eight lines or bus 452; with the other one of the two gate inputs connected to a line 512; and with the gate output connected to the corresponding line of an eight line bus 514. In this configuration, gate (array) 502 develops, on the various lines of bus 512, signals, the state of which corresponds either each to the state of the corresponding one of the eight signals (representing syndrome bits) developed on bus 452 or each to a low logic level (representing syndrome bits which are all zero, such as are generated when no error is detected), as selected responsive to the state of a mode signal developed from the mode signals externally developed on lines 490.

Error detection and correction device 300, also, includes the combination of an error decoder, error corrector, and pipe-line latch (array), collectively designated 520; a tri-state buffer (array) 522; and a number of gates, represented by a gate 524. Decoder/corrector/latch 522 is configured to receive 32-bit words of data represented by signals developed on the 32-lines of bus 488, receive syndrome bits, represented by signals developed on bus 514, and receive a pipe-line-latch enabling signal, externally developed on a line 530. Further, decoder/corrector/latch 522 is configured to correct errors in the data words delineated by the syndrome bits, to latch signals states representing the corrected data words at times delineated by the line 530 pipe-line-enabling signals, and to develop, on the various lines of a 32-line bus 532, signals representing the (corrected word) latched states. Tri-state buffer (array) 522 is of the type which has 32 separate tri-state buffers, which are arranged as four sets of eight buffers, one set of buffers for each of the respective bytes (eight-bits) of the 32-bit data word represented by signals developed on the 32-lines of bus 532. Each of the individual buffers of each set of eight buffers of tri-state buffer (array) 522 is configured to develop on the corresponding line of the 32-line, system-data-input/output bus 320 a signal, the state of which corresponds to the state of a signal developed on the corresponding line of the 32-line bus 532, at each of the times delineated by the respective one of four output-enabling signals developed on a four line bus 534. Gates represented by gate 524 are configured to develop the four output-enabling signals on bus 534 responsive to a system-data-bus-output enabling signal externally developed on a line 536 and four byte-word-transfer enabling signals externally developed on a four line bus 538. The gates represented by gate 524 and the buffers of tri-state buffer (array) 522 are configured to develop on the 32 lines of system-data-input-/output bus 320 signals representing all 32 bits of a data word or eight bits of one of the four bytes of the data word responsive to the state of the four byte-word-transfer enabling signals externally developed on bus 538.

For use with external devices, error detection and correction device 300 includes a parity logic unit 542. Unit 542 is configured to generate parity, bits from the 32-bit data word represented by the 32 signals developed on the 32 lines of bus 320 and to develop on the various lines of a four line parity input/output bus 544 signals representing the parity bits. Generated are either odd or even parity bits as selected responsive to the state of a parity selecting signal externally developed on a line 546. In addition, unit 542 generates parity bits representing individual bytes of the 32-bit date word as selected responsive to the state of the four byte-word-transfer enabling signals externally developed on bus 538. Further, unit 542 is operative to compare the state of the internally generated parity bits with parity bits represented by signals externally developed on the four lines of parity input/output bus 544 and to develop on a parity error line 548 a signal the state of which indicates whether the bits are the same.

Finally, error detection and correction device 300 includes a data latch (array) 560 and a multiplexer (array) 562. Data latch (array) 560, which is similar to data latch (array) 340, is, also, of the type which has 32 separate latches, each of which is configured to latch, in this case, the state of a signal externally developed on the corresponding line of the 32 lines of system-data-input-/output bus 320 at each of the times delineated by a system-latch enabling signal externally developed on a line 564 and to develop a signal having the latched state on the corresponding line of a 32-line bus 566. Multiplexer (array) 562 is of the type which has 32 separate multiplexers, each of the two-line-to-one-line type, which are arranged as four sets of eight multiplexers, one set of four multiplexers for each of the respective bytes (eight-bits) of the 32-bit data word represented by signals developed on the 32-lines of bus 532 (or bus 566). Each of the individual multiplexers of each set of eight multiplexers of multiplexer (array) 344 are configured to develop on the corresponding line of the corresponding set of eight lines of the 32 lines of bus 370, signals the state of which correspond either each to the state of the corresponding one of the set of eight signals developed on the corresponding eight lines of the 32 lines of bus 532 or each to the state of the corresponding one of the set of eight signals developed on the corresponding eight lines of the 32 lines of bus 566 as selected responsive to the state of the four, byte-word-transfer enabling signals externally developed on the four lines of bus 538.

In this configuration, data latch (array) 560 and multiplexer (array) 562 enable new data word byte(s) to be merged into an old (32-bit) data word.

In the presently preferred embodiment, the various components of error detection and correction device 300 are all integrated into a single device using CMOS technology.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. An error detection and correction device (300) comprising in combination:
   a first device bus (310);
   a second device bus (312);
   a third device bus (318);
   a fourth device bus (314);
   a fifth device bus (316);
   a sixth device bus (320);
   a first, data, latch means (340) connected to said first device bus (310);
   a correction check bit generator (342) connected to said first latch means (340);
   a second, check bit, latch means (346) coupled to said second device bus (312);
   a first multiplexer means (348) connected to said second device bus (312) and to said second latch means (346);
   a first gate means (350) connected to said correction check bit generator (342) and to said first multiplexer means (348);
   a second multiplexer means (352) connected to said correction check bit generator (342), to said first gate means (350), and to said third device bus (318);
   a first tri-state buffer means (380) connected to said first device bus (310);
   a second tri-state buffer means (382) connected to said fifth device bus (316);
   a generation check bit generator (400) connected to said first tri-state buffer means (380);
   a third multiplexer means (402) connected to said correction check bit generator (342) and to said fourth device bus (314);
   a second gate means (404) connected to said third multiplexer means (402) and to said generation check bit generator (400);
   a fourth multiplexer means (406) connected to said second gate means (404), to said generation check bit generator (400), and to said second tri-state buffer means (382);
   a third gate means (408) connected to said fourth device bus (314) and to said first gate means (350);
   a fifth multiplexer means (410) connected to said third gate means (408) and to said first gate means (350);
   a combination of an error decoder, error corrector, and pipe-line latch means (520), the combination coupled to said fifth multiplexer means (410);
   a third tri-state buffer means (522) connected between said error decoder, error corrector, and pipe-line latch means combination (520) and said sixth device bus (320);
   a third, data, latch means (560) connected to said sixth device bus (320); and
   a sixth multiplexer means (562) connected to said error decoder, error corrector, and pipe-line latch means combination (520), to said third latch means (560), and to said first tri-state buffer means (380).

2. An error detection and correction system comprising in combination:
   a first system bus (220);
   a second system bus (222);
   a third system bus (224);
   a fourth system bus (226);
   a fifth system bus (228);
   a sixth system bus (230);
   a seventh system bus (234);
   an eighth system bus (236);
   a ninth system bus (240); and
   a pair of similar, error detection and correction devices, including a first device (210) connected to said first (220), said second (222), said third (224), said fourth (226), said fifth (228) and said sixth (230) system busses and a second device (212) connected to said third (224), said fourth (226), said fifth (228), said seventh (234), said eighth (236), and said ninth (240) system busses,
   said first device (210) including means for receiving on said sixth system bus (230) a set of externally developed signals representing a first predetermined portion of a first word of data, for developing on said first system bus (220) a set of signals representing said first data word first predetermined portion, for generating a set of partial check bits from said first data word first predetermined portion, for developing on said fourth system bus (226) a set of signals representing said first data word first predetermined portion partial check bits, for receiving on said first system bus (220) a set of externally developed signals representing said first predetermined portion of a second word of data, for receiving on said second system bus (222) a set of externally developed signals representing a set of second data word final check bits, for generating a set of partial check bits from said second data word first predetermined portion, for generating a set of first device (210) partial syndromes bits from said second data word final check bits and said second data word first predetermined portion partial check bits, for developing on said third system bus (224) a set of signals representing said first device (210) partial syndrome bits, for receiving on said fifth system bus (228) a set of signals representing second device (212) partial check bits, for generating a set of first device (210) full syndrome bits from said second data word first predetermined portion partial check bits and said second device (212) partial check bits, for correcting errors in said second data word first predetermined portion, and for developing on said sixth system bus (230) a set of signals representing said corrected second data word first predetermined portion, and
   said second device (212) including means for receiving on said ninth system bus (240) a set of externally developed signals representing a second predetermined portion of said first data word, for developing on said seventh system bus (234) a set of signals representing said first data word second predetermined portion, for receiving on said fourth system bus (226) the signals representing said first data word first predetermined portion partial check bits, for generating a set of first data word final check bits from said first data word second predetermined portion and said first data word first predetermined portion partial check bits, for developing on said eighth system bus (236) a set of signals representing said first data word final check bits, for receiving on said seventh system bus (234) a set of externally developed signals representing said second predetermined portion of said second word of data, for generating a set of said second device (212) partial check bits from said second data word second predetermined portion, for developing on said fifth system bus (228) second device partial check bits signals, for receiving on said third system bus (224) the signals representing said first device (210) partial syndrome bits, for generating a set of second device (212) full syndrome bits from said second device (212) partial check bits and said first device (210) partial syndrome bits, for correcting errors in said second data word second predetermined portion, and for developing on said ninth system bus (240) a set of signals representing said corrected second data word second predetermined portion; and wherein at least one of said pair of error detection and correction devices includes,
  a first device bus (310);
  a second device bus (312);
  a third device bus (318);
  a first, data, latch means (340) connected to said first device bus (310);
  a correction check bit generator (342) connected to said first latch means (340);
  a second, check bit, latch means (346) coupled to said second device bus (312);
  a first multiplexer means (348) connected to said second device bus (312) and to said second latch means (346);
  a first gate means (350) connected to said correction check bit generator (342) and to said first multiplexer means (348);
  a second multiplexer means (352) connected to said correction check bit generator (342), to said first gate means (350), and to said third device bus (318);
  a fourth device bus (314);
  a fifth device bus (316);
  a first tri-state buffer means (380) connected to said first device bus (310);
  a second tri-state buffer means (382) connected to said fifth device bus (316);
  a generation check bit generator (400) connected to said first tri-state buffer means (380) a third multiplexer means (402) connected to said correction check bit generator (342) and to said fourth device bus (314);
  a second gate means (404) connected to said third multiplexer means (402) and to said generation check bit generator (400); and
  a fourth multiplexer means (406) connected to said second gate means (404), to said generation check bit generator (430), and to said second tri-state buffer means (382).

3. An error detection and correction system as recited in claim 2 wherein said one of said pair of error detection and correction devices further includes,
  a sixth device bus (320);
  a third gate means (408) connected to said fourth device bus (314) and to said first gate means (350);
  a fifth multiplexer means (410) connected to said third gate means (408) and to said first gate means (350);
  a combination of an error decoder, error corrector, and pipeline latch means (520), the combination coupled to said fifth multiplexer means (410); and
  a third tri-state buffer means (522) connected between said error decoder, error corrector, and pipeline latch means combination (520) and said sixth device bus (320).

4. An error detection and correction system as recited in claim 3 wherein said one of said pair of error detection and correction devices further includes,
  a third, data, latch means (560) connected to said sixth device bus (320); and
  a sixth multiplexer means (562) connected to said error decoder, error corrector, and pipe-line latch means combination (520), to said third latch means (560), and to said first tri-state buffer means (380).

5. An error detection and correction system comprising in combination:
  a first system bus (220);
  a second system bus (222);
  a third system bus (224);
  a fourth system bus (226);
  a fifth system bus (228);
  a sixth system bus (230);
  a seventh system bus (234);
  an eighth system bus (236);
  a ninth system bus (240); and
  a pair of similar, error detection and correction devices, including a first device (210) connected to said first (220), said second (222), said third (224), said fourth (226), said fifth (228) and said sixth (230) system busses and a second device (212) connected to said third (224), said fourth (226), said fifth (228), said seventh (234), said eighth (236), and said ninth (240) system busses,
  said first device (210) including means for receiving on said sixth system bus (230) a set of externally developed signals representing a first predetermined portion of a first word of data, for developing on said first system bus (220) a set of signals representing said first data word first predetermined portion, for generating a set of partial check bits from said first data word first predetermined portion, for developing on said fourth system bus (226) a set of signals representing said first data word first predetermined portion partial check bits, for receiving on said first system bus (220) a set of externally developed signals representing said first predetermined portion of a second word of data, for receiving on said second system bus (222) a set of externally developed signals representing a set of second data word final check bits, for generating a set of partial check bits from said second data word first predetermined portion, for generating a set of first device (210) partial syndromes bits from said second data word final check bits and said second data word first predetermined portion partial check bits, for developing on said third system bus (224) a set of signals representing said first device (210) partial syndrome bits, for receiving on said fifth system bus (228) a set of signals representing second device (212) partial check bits, for generating a set of first device (210) full syndrome bits from said second data word first predetermined portion partial check bits and said second device (212) partial check bits, for correcting errors in said second data word first predetermined portion, and for developing on said sixth system bus (230) a set of signals representing said corrected second data word first predetermined portion, and said second device (212) including means for receiving on said ninth system bus (240) a set of externally developed signals representing a second predetermined portion of said first data word, for developing on said seventh system bus (234) a set of signals representing said first data word second predetermined portion, for receiving on said fourth system bus (226) the signals representing said first data word first predetermined portion partial check bits, for generating a set of first data word final check bits from said first data word second predetermined portion and said first data word first predetermined portion partial check bits, for developing on said eighth system bus (236) a set of signals representing said first data word final check bits, for receiving on said seventh system bus (234) a set of externally developed signals representing said second predetermined portion of said second word of data, for generating a set of said second device (212) partial check bits from said second data word second predetermined portion, for developing on said fifth system bus (228) second device partial check bits signals, for receiving on said third system bus (224) the signals representing said first device (210) partial syndrome bits, for generating a set 70 of second device (212) full syndrome bits from said second device (212) partial check bits and said first device (210) partial syndrome bits, for correcting errors in said second data word second predetermined portion, and for developing on said ninth system bus (240) a set of signals representing said corrected second data word second predetermined portion;

wherein said first device (210) includes,
a first device bus (310) connected to said first system bus (220);
second device bus (312) connected to said second system bus (222);
a third device bus (318) connected to said third system bus (224);
a fourth device bus (314) connected to said fifth system bus (228);
a fifth device bus (316) connected to said fourth system bus (226);
a sixth device bus (320) connected to said sixth system bus (230);
a first, data, latch means (340) connected to said first device bus (310);
a correction check bit generator (342) connected to said first latch means (340);
a second, check bit, latch means (346) coupled to said second device bus (312);
a first multiplexer means (348) connected to said second device bus (312) and to said second latch means (346);
a first gate means (350) connected to said correction check bit generator (342) and to said first multiplexer means (348);
a second multiplexer means (352) connected to said correction check bit generator (342), to said first gate means (350), and to said third device bus (318);
a first tri-state buffer means (380) connected to said first device bus (310);

a second tri-state buffer means (382) connected to said fifth device bus (316);
a generation check bit generator (400) connected to said first tri-state buffer means (380);
a third multiplexer means (402) connected to said correction check bit generator (342) and to said fourth device bus (314);
a second gate means (404) connected to said third multiplexer means (402) and to said generation check bit generator (400);
a fourth multiplexer means (406) connected to said second gate means (404), to said generation check bits generator (400), and to said second tri-state buffer means (382);
a third gate means (408) connected to said fourth device bus (314) and to said first gate means (350)
a fifth multiplexer means (410) connected to said third gate means (408) and to said first gate means (350);
a combination of an error decoder, error corrector, and pipeline latch means (520), the combination coupled to said fifth multiplexer means (410);
a third tri-state buffer means (522) connected between said error decoder, error corrector, and pipeline latch means combination (520) and said sixth device bus (320);
a third, data, latch means (560) connected to said sixth device bus (320); and
a sixth multiplexer means (562) connected to said error decoder, error corrector, and pipeline latch means combination (520), to said third latch means (560), and to said first tri-state buffer means (380).

6. An error detection and correction system comprising in combination:
a first system bus (220);
a second system bus (222);
a third system bus (224);
a fourth system bus (226);
a fifth system bus (228);
a sixth system bus (230);
a seventh system bus (234);
an eighth system bus (236);
a ninth system bus (240); and
a pair of similar, error detection and correction devices, including a first device (210) connected to said first (220), said second (222), said third (224), said fourth (226), said fifth (228) and said sixth (230) system busses and a second device (212) connected to said third (224), said fourth (226), said fifth (228), said seventh (234), said eighth (236), and said ninth (240) system busses, said first device (210) including means for receiving on said sixth system bus (230) a set of externally developed signals representing a first predetermined portion of a first word of data, for developing on said first system bus (220) a set of signals representing said first data word first predetermined portion, for generating a set of partial check bits from said first data word first predetermined portion, for developing on said fourth system bus (226) a set of signals representing said first data word first predetermined portion partial check bits, for receiving on said first system bus (220) a set of externally developed signals representing said first predetermined portion of a second word of data, for receiving on said second system bus (222) a set of externally developed signals representing a set of second data word final check bits, for generating a set of partial check bits from said second data word first predetermined portion, for generating a set of first device (210) partial syndromes bits from said second data word final check bits and said second data word first predetermined portion partial check bits, for developing on said third system bus (224) a set of signals representing said first device (210) partial syndrome bits, for receiving on said fifth system bus (228) a set of signals representing second device (212) partial check bits, for generating a set of first device (210) full syndrome bits from said second data word first predetermined portion partial check bits and said second device (212) partial check bits, for correcting errors in said second data word first predetermined portion, and for developing on said sixth system bus (230) a set of signals representing said corrected second data word first predetermined portion, and said second device (212) including means for receiving on said ninth system bus (240) a set of externally developed signals representing a second predetermined portion of said first data word, for developing on said seventh system bus (234) a set of signals representing said first data word second predetermined portion, for receiving on said fourth system bus (226) the signals representing said first data word first predetermined portion partial check bits, for generating a set of first data word final check bits from said first data word second predetermined portion and said first data word first predetermined portion partial check bits, for developing on said eighth system bus (236) a set of signals representing said first data word final check bits, for receiving on said seventh system bus (234) a set of externally developed signals representing said second predetermined portion of said second word of data, for generating a set of said second device (212) partial check bits from said second data word second predetermined portion, for developing on said fifth system bus (228) second device partial check bits signals, for receiving on said third system bus (224) the signals representing said first device (210) partial syndrome bits, for generating a set of second device (212) full syndrome bits from said second device (212) partial check bits and said first device (210) partial syndrome bits, for correcting errors in said second data word second predetermined portion, and for developing on said ninth system bus (240) a set of signals representing said corrected second data word second predetermined portion;

wherein said second device (212) includes,
a first device bus (310) connected to said seventh system bus (234);
a second device bus (312) connected to said third system bus (224);
a third device bus (318) connected to said fifth system bus (228);
a fourth device bus (314) connected to said fourth system bus (226);
a fifth device bus (316) connected to said eighth system bus (236);
a sixth device bus (320) connected to said ninth system bus (240);
a first, data, latch means (340) connected to said first device bus (310);

a correction check bit generator (342) connected to said first latch means (340);
a second, check bit, latch means (346) coupled to said second device bus (312);
a first multiplexer means (348) connected to said second device bus (312) and to said second latch means (346);
a first gate means (350) connected to said correction check bit generator (342) and to said first multiplexer means (348);
a second multiplexer means (352) connected to said correction check bit generator (342), to said first gate means (350), and to said third device bus (318);
a first tri-state buffer means (380) connected to said first device bus (310);
a second tri-state buffer means (382) connected to said fifth device bus (316);
a generation check bit generator (400) connected to said first tri-state buffer means (380);
a third multiplexer means (402) connected to said correction check bit generator (342) and to said fourth device bus (314);
a second gate means (404) connected to said third multiplexer means (402) and to said generation check bit generator (400);
a fourth multiplexer means (406) connected to said second gate means (404), to said generation check bit generator (400), and to said second tri-state buffer means (382);
a third gate means (408) connected to said fourth device bus (314) and to said first gate means (350);
a fifth multiplexer means (410) connected to said third gate means (408) and to said first gate means (350);
a combination of an error decoder, error corrector, and pipeline latch means (520), the combination coupled to said fifth multiplexer means (410);
a third tri-state buffer means (522) connected between said error decoder, error corrector, and pipeline latch means combination (520) and said sixth device bus (320);
a third, data, latch means (560) connected to said sixth device bus (320); and
a sixth multiplexer means (562) connected to said error decoder, error corrector, and pipeline latch means combination (520), to said third latch means (560), and to said first tri-state buffer means (380).

7. An error detection and correction device comprising in combination:
a first device bus (310);
a second device bus (312);
a third device bus (318);
a first, data, latch means (340) connected to said first device bus (310);
a correction check bit generator (342) connected to said first latch means (340);
a second, check bit, latch means (346) coupled to said second device bus (312);
a first multiplexer means (348) connected to said second device bus (312) and to said second latch means (346);
a first gate means (350) connected to said correction check bit generator (342) and to said first multiplexer means (348);

a second multiplexer means (352) connected to said correction check bit generator (342), to said first gate means (350), and to said third device bus (318);

a fourth device bus (314);

a fifth device bus (316);

a first tri-state buffer means (380) connected to said first device bus (310);

a second tri-state buffer means (382) connected to said fifth device bus (316);

a generation check bit generator (400) connected to said first tri-state buffer means (380);

a third multiplexer means (402) connected to said correction check bit generator (342) and to said fourth device bus (314);

a second gate means (404) connected to said third multiplexer means (402) and to said generation check bit generator (400); and a fourth multiplexer means (406) connected to said second gate means (404), to said generation check bit generator (400), and to said second tri-state buffer means (382).

8. An error detection and correction device as recited in claim 7 further comprising:

a sixth device bus (320);

a third gate means (408) connected to said fourth device bus (314) and to said first gate means (350);

a fifth multiplexer means (410) connected to said third gate means (408) and to said first gate means (350);

a combination of an error decoder, error corrector, and pipeline latch means (520), the combination coupled to said fifth multiplexer means (410); and a third tri-state buffer means (522) connected between said error decoder, error corrector, and pipeline latch means combination (520) and said sixth device bus (320).

9. An error detection and correction device as recited in claim 8 further comprising:

a third, data, latch means (560) connected to said sixth device bus (320); and a sixth multiplexer means (562) connected to said error decoder, error corrector, and pipe-line latch means combination (520), to said third latch means (560), and to said first tri-state buffer means (380).

10. An error detection and correction (EDC) device (300) for inclusion in a memory system that includes an identical pair of first and second EDC devices, each EDC device comprising:

a data input latch (340) for receiving half of a parallel set of bits from a memory system;

a data output latch (560) for transmitting said half of parallel set of bits to said memory system; a check bit input latch (346) for receiving a plurality of check bits or partial syndrome bits from an external source;

a check bit generator (342) having an input (364) for receiving a plurality of latched input bits from the data input latch (340);

a preliminary syndrome generator (350) having a first input from the check bit generator (342) and a second input from the check bit latch (346);

a first multiplexer (352) for selecting for output a set of correction partial check bits (378) from a first input coupled to the check bit generator (342) or a set of partial syndrome bits on pins (314) from the preliminary syndrome generator;

a final syndrome generator (408) having a first input for receiving a set of partial check bits from an external source and a second input coupled to the preliminary syndrome generator (350);

a second multiplexor (410) for selecting for output a first input from the final syndrome generator (408) or a second input from the preliminary syndrome generator (350);

a bit error decoder (520) having an input from the second multiplexer (410);

a correction logic (520) having a first input from the bit error decoder, a second input from a multiplexer (468) coupled to data latch (340), and a data output to a pipeline latch; and mode selection means (490, 502, 512) for assigning said first and second EDC devices to opposite bit processing roles that include, a least significant data (LSD) bit processing role in which the first multiplexor (352) selects its second input such that said set of partial syndrome bits (378) is output on pins (318) and the check bit input latch (346) is configured to receive a plurality of check bits from said memory system, and a most significant data (MSD) bit processing role in which the first multiplexer (352) selects its first input (364) such that another set of correction partial check bits is output and the check bit input latch (346) is configured to receive said set of partial syndrome bits from the EDC device in said LSD bit processing role, and said preliminary syndrome generator (350) receives input from said check bit latch (346) containing partial syndrome information and second input from check bit generator (342), and said multiplexer (410) selects a final syndrome from said final syndrome generator (408) and the final syndrome generator (408) is configured to receive said set of partial check bits on pins (314) on said first input and partial syndrome bits (378) on said second input.

* * * * *